United States Patent
Townley et al.

(10) Patent No.: US 10,882,444 B2
(45) Date of Patent: Jan. 5, 2021

(54) CONTROL SYSTEM WITH TEXTILE HAVING CONDUCTIVE ELEMENT FOR CONTROLLING OPERATION OF A VEHICLE SYSTEM

(71) Applicant: Lear Corporation, Southfield, MI (US)

(72) Inventors: Lisa Townley, Allen Park, MI (US); Michael Hans, Novi, MI (US); Paul S. Severinski, Brownstown, MI (US); John M. Sember, Redford, MI (US)

(73) Assignee: Lear Corporation, Southfield, MI (US)

( * ) Notice: Subject to any disclaimer, the term of this patent is extended or adjusted under 35 U.S.C. 154(b) by 0 days.

(21) Appl. No.: 16/522,729

(22) Filed: Jul. 26, 2019

(65) Prior Publication Data

US 2020/0101895 A1   Apr. 2, 2020

Related U.S. Application Data

(60) Provisional application No. 62/737,472, filed on Sep. 27, 2018.

(51) Int. Cl.
| | |
|---|---|
| *B60Q 3/80* | (2017.01) |
| *B60R 21/015* | (2006.01) |
| *B60N 2/00* | (2006.01) |
| *H03K 17/96* | (2006.01) |

(52) U.S. Cl.
CPC ............ *B60Q 3/80* (2017.02); *B60N 2/002* (2013.01); *B60R 21/01532* (2014.10); *H03K 17/96* (2013.01)

(58) Field of Classification Search
CPC .. B60Q 3/80; B60Q 21/016; B60R 21/01532; B60N 2/002; B60N 2/00; H03K 17/96
See application file for complete search history.

(56) References Cited

U.S. PATENT DOCUMENTS

| | | | |
|---|---|---|---|
| 6,812,431 | B2 | 11/2004 | Morinet et al. |
| 7,054,133 | B2 | 5/2006 | Orth |
| 9,577,374 | B1 | 2/2017 | Grant et al. |
| 9,588,625 | B2 | 3/2017 | Poupyrev |
| 9,642,398 | B1 | 5/2017 | Mason et al. |
| 9,815,387 | B2 | 11/2017 | Frye et al. |
| 9,933,908 | B2 | 4/2018 | Poupyrev |
| 9,983,747 | B2 | 5/2018 | Poupyrev |
| 10,245,976 | B2 | 4/2019 | Hotary et al. |

(Continued)

FOREIGN PATENT DOCUMENTS

| | | |
|---|---|---|
| DE | 102014117758 A1 | 6/2016 |
| FR | 2871118 B1 | 9/2006 |
| FR | 2868999 B1 | 7/2007 |

*Primary Examiner* — Robert L Deberadinis
(74) *Attorney, Agent, or Firm* — Brooks Kushman P.C.

(57) ABSTRACT

A control system for controlling operation of a vehicle system is described. The control system includes a trim cover textile configured to cover at least a portion of a vehicle component and having an electrically conductive element configured to provide a capacitive touch functionality. In response to a user touch, the electrically conductive element generates a signal representative of a user command for the vehicle system. The system also includes a control unit adapted to be provided in electrical communication with the electrically conductive element of the trim cover. The control unit is configured to receive the user command signal and, in response, generate a control signal to effectuate control of the vehicle system.

20 Claims, 4 Drawing Sheets

(56) References Cited

U.S. PATENT DOCUMENTS

| | | |
|---|---|---|
| 10,266,083 B2 | 4/2019 | Worlitz |
| 10,315,402 B2 | 6/2019 | Brook et al. |
| 10,377,268 B2 | 8/2019 | Worlitz |
| 2007/0235297 A1* | 10/2007 | Stoschek ........... B60R 21/01516 200/5 R |
| 2016/0270727 A1* | 9/2016 | Berg .................... A61B 5/0006 |
| 2017/0291518 A1 | 10/2017 | Kozlowski |
| 2019/0107641 A1 | 4/2019 | Perraut |

* cited by examiner

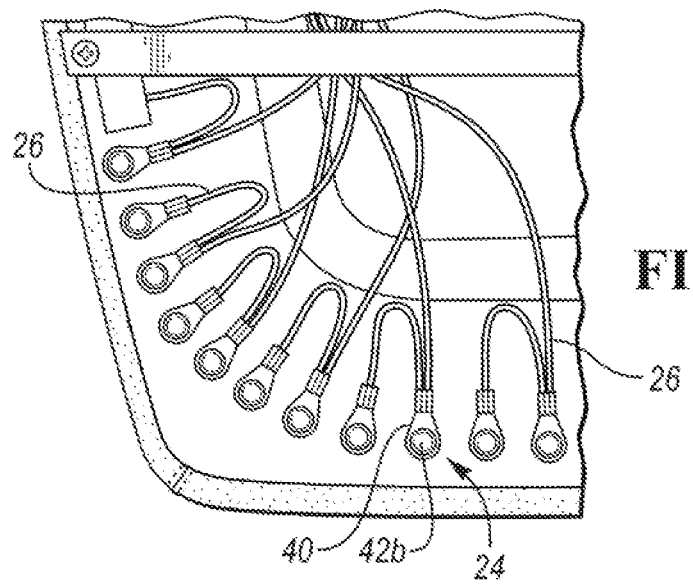
FIG. 5
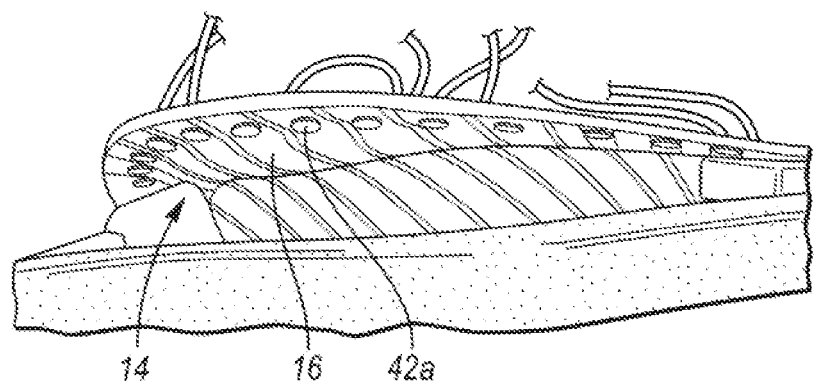
FIG. 6
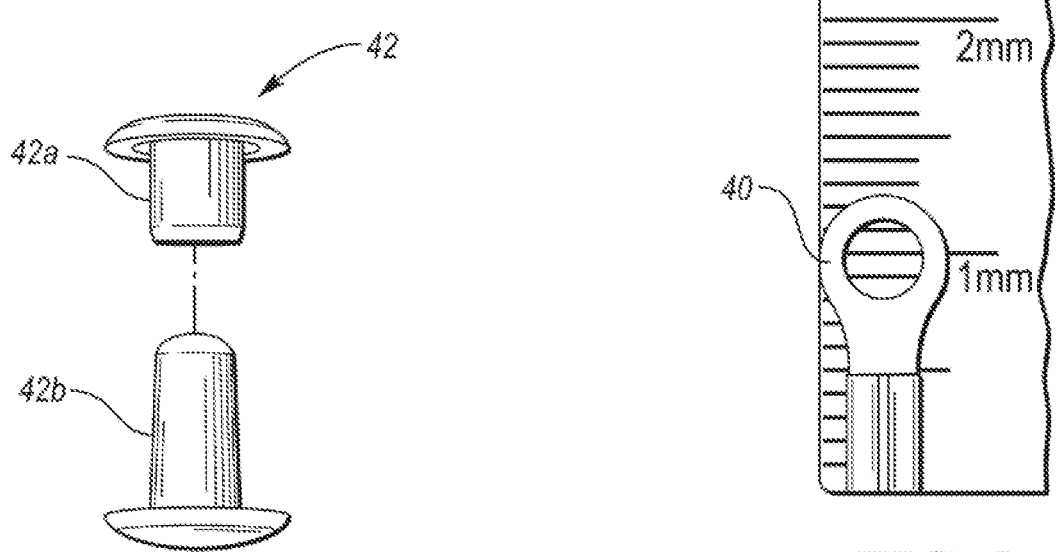
FIG. 7
FIG. 8

CONTROL SYSTEM WITH TEXTILE HAVING CONDUCTIVE ELEMENT FOR CONTROLLING OPERATION OF A VEHICLE SYSTEM

CROSS-REFERENCE TO RELATED APPLICATIONS

This application claims the benefit of U.S. provisional application Ser. No. 62/737,472 filed Sep. 27, 2018, the disclosure of which is hereby incorporated in its entirety by reference herein.

TECHNICAL FIELD

The following relates to control systems for controlling operation of vehicle systems, the control systems comprising textiles with conductive features for electrically connecting such textiles to control units or modules, thereby enabling vehicle system controls to be integrated into vehicle components such as seats or headliner trims and a method for manufacturing such textiles. Such connected textiles may also provide for control of various vehicle systems, such as through capacitive touch functionality.

BACKGROUND

In autonomous and other advance vehicles, there is a need for improved control systems or mechanisms to enable advanced end-user engagement. Such improved control systems would ideally be integrated into vehicle seats, headliners, or other interior components and become a center for occupant information and connectivity.

SUMMARY

According to one non-limiting exemplary embodiment of the present disclosure, a control system is provided for controlling operation of a vehicle system. The control system comprises a trim cover textile configured to cover at least a portion of a vehicle component, the trim cover textile comprising an electrically conductive element configured to provide a capacitive touch functionality. In response to a user touch, the electrically conductive element generates a signal representative of a user command for the vehicle system. The control system further comprises a control unit adapted to be provided in electrical communication with the electrically conductive element of the trim cover. The control unit is configured to receive the user command signal and, in response, generate a control signal to effectuate control of the vehicle system.

According to another non-limiting exemplary embodiment of the present disclosure, a control system for controlling operation of a vehicle system is provided. The control system comprises a trim cover textile configured to cover at least a portion of a vehicle component, the trim cover textile comprising a control switch having an electrically conductive element configured as a line, lead, trace, or track, the control switch configured to provide a capacitive touch functionality. In response to a user touch, the control switch generates a signal representative of a user command for the vehicle system. The control system further comprises a control unit adapted to be provided in electrical communication with the electrically conductive element of the trim cover. The control unit is configured to receive the user command signal and, in response, generate a control signal to effectuate control of the vehicle system.

A detailed description of these and other non-limiting exemplary embodiments of a control system for controlling operation of a vehicle system is set forth below together with the accompanying drawings.

BRIEF DESCRIPTION OF THE DRAWINGS

FIG. 5 is a perspective view of a section of the vehicle seat portion of FIG. 2 according to one non-limiting exemplary embodiment of the present disclosure;

FIG. 6 is an exploded side view of a section of the vehicle seat portion shown in FIG. 2 according to one non-limiting exemplary embodiment of the present disclosure;

FIG. 7 is a perspective view of a conductive rivet for use with a connected textile according to one non-limiting exemplary embodiment of the present disclosure;

FIG. 8 is a perspective view of an electrical ring connector for use with a connected textile according to one non-limiting exemplary embodiment of the present disclosure;

DETAILED DESCRIPTION

Figure 1:
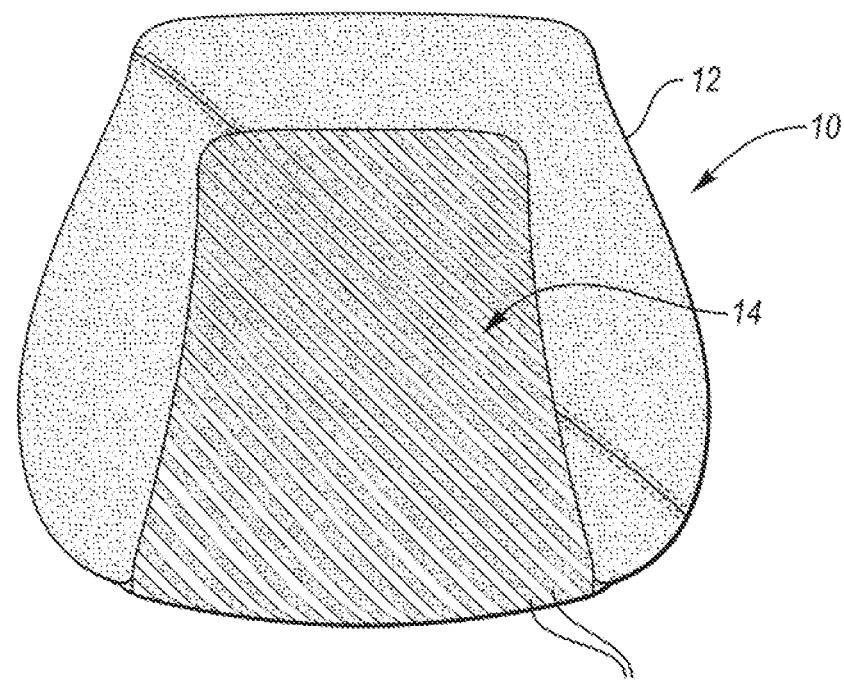
FIG. 1 is a perspective view of a front or top side of a vehicle seat portion having a trim comprising a connected textile according to one non-limiting exemplary embodiment of the present disclosure.

Various detailed non-limiting embodiments are disclosed herein. However, it is to be understood that the disclosed embodiments are merely exemplary and may take various and alternative forms. The figures are not necessarily to scale, and features may be exaggerated or minimized to show details of particular components. Therefore, specific structural and functional details disclosed herein are not to be interpreted as limiting, but merely as a representative basis for teaching one skilled in the art.

With reference to FIGS. 1-12, a more detailed description of various non-limiting exemplary embodiments of a connected textile and method for manufacturing same will be provided. For ease of illustration and to facilitate understanding, like reference numerals have been used herein for like components and features throughout the drawings.

The present disclosure is directed to control systems for controlling operation of vehicle systems, the control system comprising textiles having conductive features for electrically connecting such textiles to control units or modules, thereby enabling vehicle system controls to be integrated into vehicle components such as seats or headliner trims, and a method for manufacturing such textiles. Such connected textiles may also provide for control of various vehicle systems, such as through capacitive touch functionality.

Key areas for electronic textile development are health monitoring, climate management, pressure sensing, illumination and alternative control mechanisms. In anticipation for autonomous and other advanced vehicles, seats may become the center of occupant information and connectivity. Technologically advanced E-TexStyles™ feature heat generating yarns structures, electronically active yarns, textile transducers and sensors. Fabric composites can collect responses and transmit through electronic algorithms & modules. Advantages associated with such composites include reduced energy consumption, new vehicle design and technical features, enabling advanced end-user engagement, improved vehicle safety and comfort, additional vehicle system controls in a vehicle seat or headliner trim, and ambient light increases spatial perception with a vehicle interior, and interior applications including potential for vertical integration of technology into trim cover assemblies.

Figure 2:
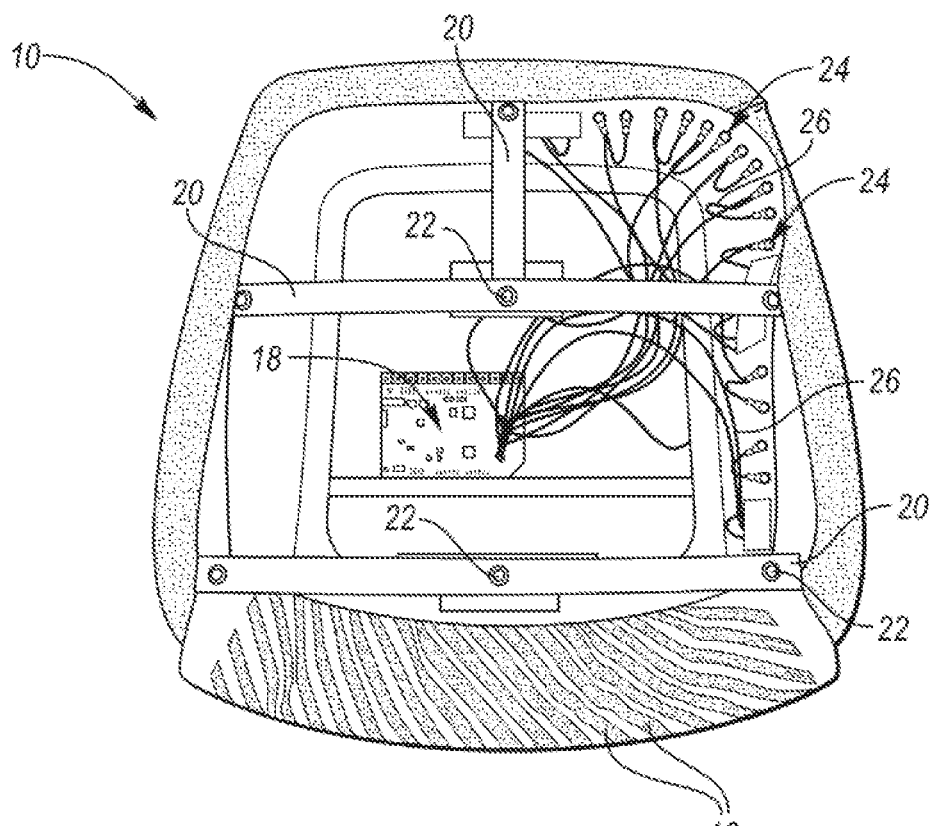
FIG. 2 is a perspective view of a back or bottom side of the vehicle seat portion shown in FIG. 1 according to one non-limiting exemplary embodiment of the present disclosure.

Referring now to FIGS. 1 and 2, perspective views are shown of a front (or top) side and a back (or bottom) side of a portion of a vehicle seat 10, such as a seat bottom or a seat back. As seen in FIG. 1, the vehicle seat portion 10 comprises a trim cover having an outer or peripheral portion 12 and an inner or main portion 14. The main portion 14 comprises a textile having a plurality of conductive elements 16. While the conductive elements 16 are illustrated in FIG. 1 as parallel lines, leads, traces, or tracks, it should be noted that the conductive elements 16 may be provided with any pattern, size, or shape. While illustrated in FIG. 1 on the entire main portion 14, it should also be noted that the conductive elements 16 could alternatively be provided in any part of the main portion 14. It should still further be noted that the conductive elements could alternatively or in addition be provided on the entirety or any part of the peripheral portion 12 of the trim cover of the vehicle seat portion 10. Moreover, vehicle seat portion 10 may be part of a vehicle seat system and conductive elements 16 may alternatively or in addition be provided on a side-facing portion of a vehicle seat trim cover.

As seen in FIG. 2, a control unit or module 18, which may be an off-the-shelf Central Processing Unit (CPU) and associated housing, may be mounted to the vehicle seat portion 10 via straps 20 and fasteners 22. The control unit 18 may be programmed to control any of various vehicle systems, such as internal lighting or illumination systems, infotainment systems including radio systems, voice control systems, climate control systems, or any other system. As described in greater detail below, the conductive elements 16 of the textile of the main portion 14 of the trim cover are electrically connected to the control unit 18 via electrical connectors 24 and conductive wires 26.

Figure 3:
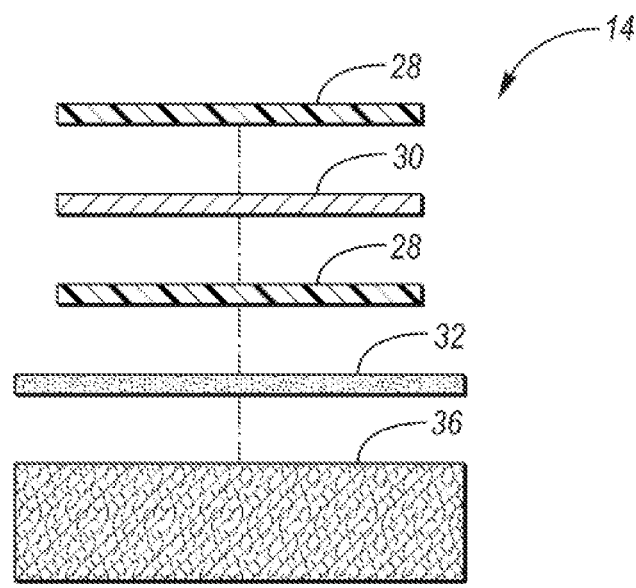
FIG. 3 is a block diagram of a connected textile according to one non-limiting exemplary embodiment of the present disclosure.

FIG. 3 illustrate a block diagram of a connected textile according to one non-limiting exemplary embodiment of the present disclosure. As seen therein, the connected textile of the main portion 14 of the trim cover (see FIG. 1) may comprise first and second encapsulant layers 28, which encapsulate a conductive track layer 30. The conductive track layer 30 includes the conductive elements 16 shown and described in connection with FIG. 1. The connected textile may further comprise an adhesive layer 32 and a base fabric or leather material layer 36. Via a thermal transfer process, the base fabric layer 36 may be joined by the adhesive layer 32 to the sub-assembly comprising the encapsulant layers 28 and the conductive track layer 30. The adhesive layer 32 thereby provides for thermal transfer of the pattern of conductive elements 16 in conductive track layer 30 (encapsulated by encapsulant layers 28) onto the base fabric layer 36.

The encapsulant layers 28 may be of the same size thickness. The adhesive layer 32 may be slightly wider than the encapsulant layers 28. The conductive track layer 30 may be of any thickness needed or desired for the track. To transfer the subassembly to the base material 36, the sub-assembly is pressed to the base material 36 at 165 Degrees and subsequently warm peeled from the base material 36. In that regard, to peel cleanly, the transfer is allowed to cool for approximately 10 seconds, but not more than approximately 20 seconds, before peeling.

Figure 4:
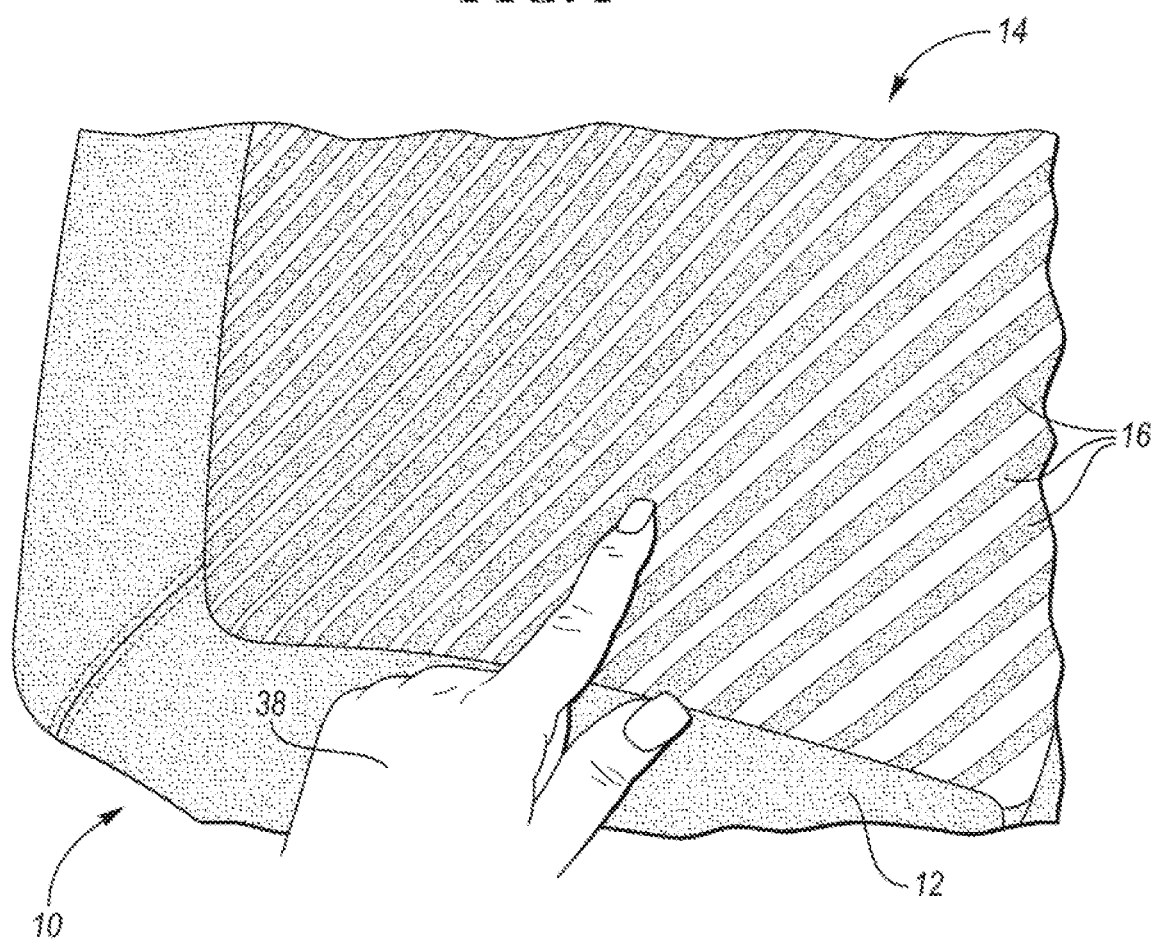
FIG. 4 is a perspective view of a section of the vehicle seat portion of FIG. 1 according to one non-limiting exemplary embodiment of the present disclosure.
Figure 9:
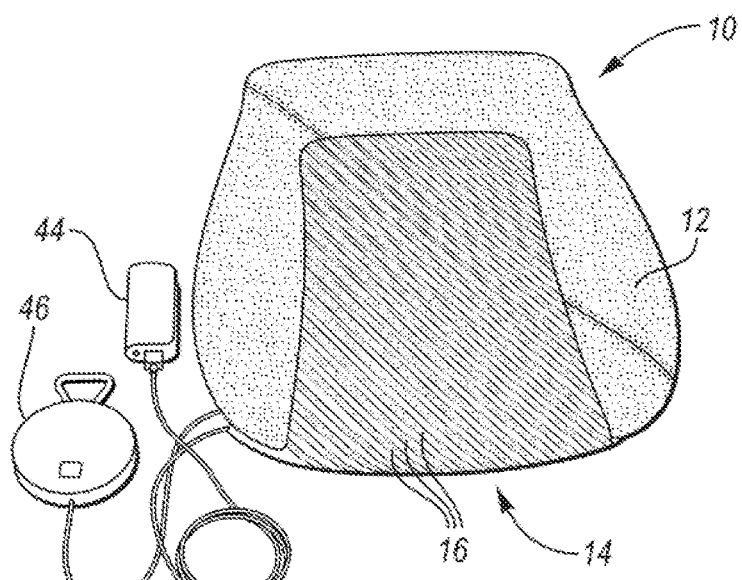
FIG. 9 is a perspective view of a front or top side of a vehicle seat portion having a trim comprising a connected textile according to one non-limiting exemplary embodiment of the present disclosure with connections to additional electrical components.

FIG. 4 is a perspective view of a section of the vehicle seat portion of FIG. 1 according to one non-limiting exemplary embodiment of the present disclosure. As seen therein, the conductive elements 16 of the textile of the main portion 14 of the trim cover may be configured to provide a capacitive touch functionality that enables a user 38 to enter a command via the textile material of the main portion 14 of the trim cover to control a vehicle system owing to the connection of the conductive elements 16 to the control unit 18 via electrical connectors 24 and wires 26, as previously described in connection with FIG. 2. That is, the conductive elements 16 of the textile of the main portion 14 of the trim cover may function as control elements or control switches for controlling the operation or functionality of a vehicle system, such as internal lighting or illumination systems, infotainment systems including radio systems, voice control systems, climate control systems, or any other system.

FIGS. 5 and 6 depict a perspective view and an exploded side view of a section of the vehicle seat portion of FIG. 2 according to one non-limiting exemplary embodiment of the present disclosure. FIGS. 7 and 8 illustrate perspective views of a conductive rivet and an electrical ring connector for use with a connected textile according to one non-limiting exemplary embodiment of the present disclosure.

As previously described in connection with FIGS. 1 and 2, the electrical connectors 24 and electrical wires 26 connect the conductive elements 16 of the textile of the main portion 14 of the trim cover to the control unit 18. As seen in FIGS. 5-8, each electrical connector 24 may comprise an electrical ring connector 40 and an electrically conductive rivet 42. In that regard, each electrically conductive rivet 42 may comprise a two-piece smash rivet well known in the art having a first portion 42a and a second portion 42b. The rivet 42, including first and second portions 42a and 42b, may comprise brass or any other electrically conductive material suitable for use as a rivet.

Still referring to FIGS. 5-8, each electrically conductive element 16 may be configured to receive a first portion 42a of an electrically conductive rivet 42. The second portion 42b of such a rivet 42 is configured to cooperate with an electrical ring connector 40, which is itself connected to an electrically conductive wire 26. The electrically conductive wires 26 are in turn connected to the control unit 18 (see FIG. 2), thereby establishing one or more connections between control unit 18 and the conductive elements 16 of the textile of the main portion 14 of the trim cover. In that regard, the electrically conductive rivet 42, including first and second portions 42a and 42b, are smashed, crushed, compressed, or deformed in a fashion well known in the art to create a mechanical and electrical connection between the electrically conductive ring connector 40 and the conductive element 16 of the textile of the main portion 14 of the trim cover.

Similar to FIGS. 1 and 2, FIGS. 9 and 10 are perspective views of a front (or top) side and a back (or bottom) side of a vehicle seat portion according to one non-limiting exemplary embodiment of the present disclosure, including connections to additional electrical components. As seen therein a power source 44, such as a battery, and an output device 46, such as a speaker, may be connected via wires 48 and 50 to the control unit 18. In that regard, battery 44 may provide a power source for operation of the conductive elements 16, control unit 18, and speaker 46. As a result, using the previously described capacitive touch functionality of the conductive elements 16 of the textile of the main portion 14 of the trim cover, a user 38 (see FIG. 4) may control the speaker 46 to produce and or respond to audio tones, chimes, alerts or other output messages from the speaker 46. It should be noted that such an output device 46 and control thereof represents an exemplary embodiment, and the connected textile as described herein may be configured for control of several types of vehicle systems as previously described, such as internal lighting or illumination systems, infotainment systems including radio systems, voice control systems, climate control systems, or any other system.

FIGS. 1-10 thus illustrate the use of a thermal transfer with rivet type connection on functional textiles operating with capacitive touch. The thermal transfer or other type of functional textile as described herein may be applied to or integrated in or on a front or top (A) surface or side of a trim cover or a vehicle seat as shown for example in FIGS. 1, 4 and 9. Alternatively, such textile may be applied to or integrated in or on a back or bottom (B) surface or side of a trim cover or a vehicle seat, unseen by a user.

Figure 11:
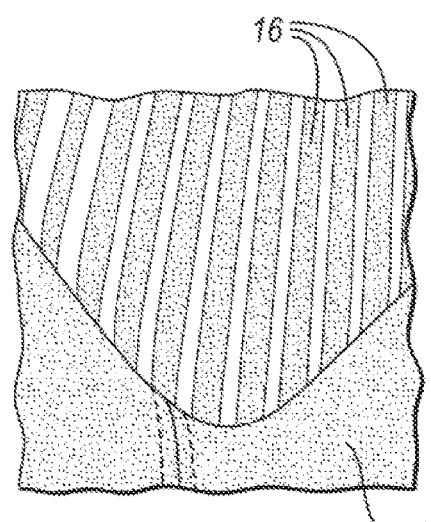
FIG. 11 is a perspective view of a section of the vehicle seat portion of FIG. 1 according to one non-limiting exemplary embodiment of the present disclosure.
Figure 10:
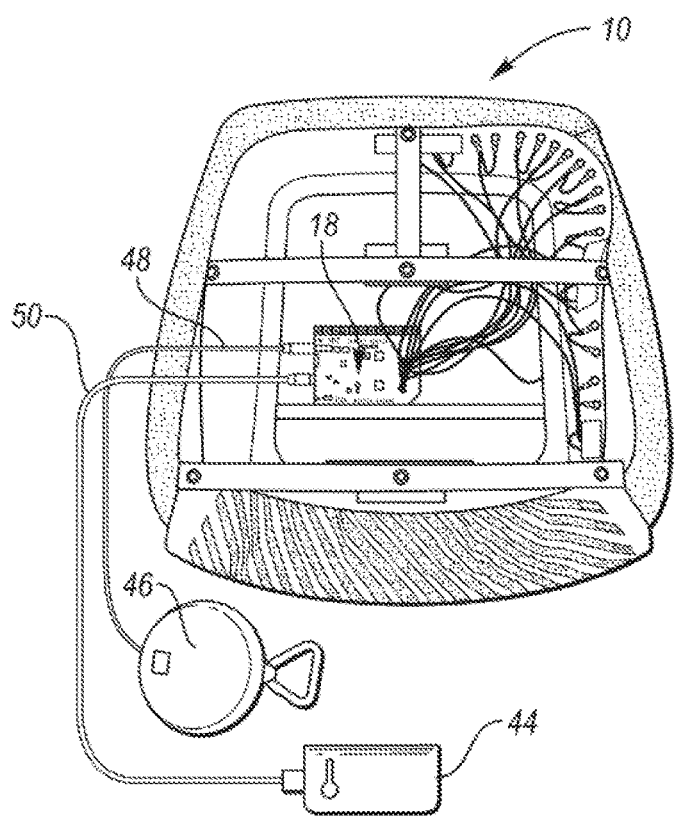
FIG. 10 is a perspective view of a back or bottom side of the vehicle seat portion shown in FIG. 10 according to one non-limiting exemplary embodiment of the present disclosure with connections to additional electrical components.

Similar to FIG. 4, FIG. 11 is a perspective view of a section of a vehicle seat portion 10 having a trim cover comprising a connected textile according to another non-limiting exemplary embodiment of the present disclosure. Once again, as seen therein, the conductive elements 16 of the textile of the main portion 14 of the trim cover may be configured to provide a capacitive touch functionality that enables a user 38 (see FIG. 4) to enter a command via the textile material of the main portion 14 of the trim cover to control a vehicle system owing to the connection of the conductive elements 16 to the control unit 18 via electrical connectors 24 and wires 26 (see FIG. 2).

Figure 12:
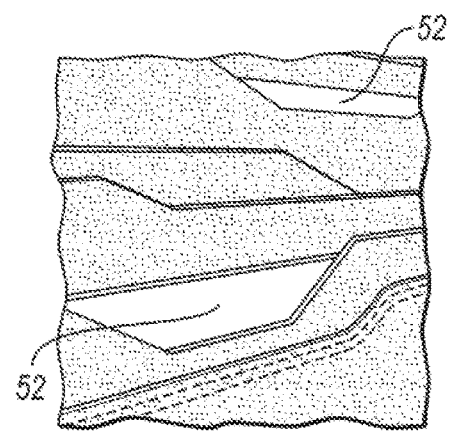
FIG. 12 is a perspective view of a section of a vehicle seat portion having a trim comprising a connected textile according to another non-limiting exemplary embodiment of the present disclosure.

FIG. 12 is a perspective view of a section of a vehicle seat portion having a trim cover comprising a connected textile according to another non-limiting exemplary embodiment of the present disclosure. As seen therein, the trim cover may comprise a textile having conductive embroidery elements 52. That is, as an alternative to the conductive elements 16 described above in connection with FIGS. 1-11, conductive elements 52 may be embroidered on or in a textile material, such as a fabric or leather. In that regard, as with the previously described conductive elements 16, such conductive elements 52 may again be configured to provide a capacitive touch functionality and may be provided in electrical communication with a control unit 18 via electrical wires 26 and electrical connectors 24, which again may comprise electrically conductive rivets 42 and electrically conductive ring connectors 40, in order to provide for control of any of several types of vehicle systems as previously described, such as internal lighting or illumination systems, infotainment systems including radio systems, voice control systems, climate control systems, or any other system.

As is readily apparent from the foregoing, various non-limiting embodiments have been described of textiles having conductive features for electrically connecting such textiles to control units or modules, thereby enabling vehicle system controls to be integrated into vehicle components such as seats or headliner trims, and methods for manufacturing such textiles. Such connected textiles may also provide for control of various vehicle systems, such as through capacitive touch functionality. In such a fashion, the present disclosure provides smart textile integration with vehicle seat trim covers and electrical systems and/or features, as well as a functional textile and a method for manufacturing and connecting textiles to vehicle electronics and systems for improved functionality and control.

While a number of embodiments have been illustrated and described herein, they are exemplary only and it is not intended that these embodiments illustrate and describe all those possible. Instead, the words used herein are words of description rather than limitation, and it is understood that various changes may be made to these embodiments without departing from the spirit and scope of the present disclosure.

What is claimed is:

1. A control system for controlling operation of a vehicle system, the control system comprising:
a trim cover textile configured to cover at least a portion of a vehicle component, the trim cover textile comprising an electrically conductive element configured to provide a capacitive touch functionality, wherein, in response to a user touch, the electrically conductive element generates a signal representative of a user command for the vehicle system, and wherein the electrically conductive element is embroidered on or in a surface of the trim cover textile; and
a control unit configured to be provided in electrical communication with the electrically conductive element of the trim cover textile, the control unit configured to receive the signal representative of the user command for the vehicle system and, in response, generate a control signal to effectuate control of the vehicle system.

2. The control system of claim 1 wherein the trim cover textile is configured to cover at least a portion of a vehicle component comprising a vehicle seat.

3. The control system of claim 2 wherein the control unit is configured to be mounted in the vehicle seat.

4. The control system of claim 1 wherein the trim cover textile is configured to cover at least a portion of a vehicle component comprising a vehicle headliner.

5. The control system of claim 1 wherein the vehicle system comprises a lighting system, an illumination system, an infotainment system, a radio system, a voice control system, or a climate control system.

6. The control system of claim 1 wherein the electrically conductive element comprises an electrically conductive line, lead, trace, or track.

7. The control system of claim 1 wherein the trim cover textile is configured to cover at least a portion of the vehicle component visible to a user.

8. The control system of claim 1 wherein the trim cover textile is configured to cover at least a portion of the vehicle component unseen by a user.

9. The control system of claim 1 wherein the trim cover textile further comprises another electrically conductive element attached to the surface of the trim cover textile and configured to provide a capacitive touch functionality.

10. The control system of claim 9 wherein the another electrically conductive element is encapsulated and the encapsulated another electrically conductive element is joined to the surface of the trim cover textile.

11. The control system of claim 1 wherein the electrically conductive element comprises a control switch for controlling operation of the vehicle system.

12. The control system of claim 1 further comprising:
an electrically conductive rivet; and
an electrical conductor having an electrically conductive ring connector;
wherein the electrically conductive ring connector and the electrically conductive element are each configured to receive the electrically conductive rivet to electrically connect the electrically conductive element and the electrical conductor, and wherein the electrical conductor is configured for electrical connection to the control unit.

13. A control system for controlling operation of a vehicle system, the control system comprising:
a trim cover textile configured to cover at least a portion of a vehicle component, the trim cover textile comprising a control switch having an electrically conductive element configured as a line, lead, trace, or track, the control switch configured to provide a capacitive touch functionality, wherein, in response to a user touch, the control switch generates a signal representative of a user command for the vehicle system, and wherein the electrically conductive element is embroidered on or in a surface of the trim cover textile; and
a control unit configured to be provided in electrical communication with the electrically conductive element of the trim cover textile, the control unit configured to receive the signal representative of the user command for the vehicle system and, in response, generate a control signal to effectuate control of the vehicle system.

14. The control system of claim 13 wherein the trim cover textile is configured to cover at least a portion of a vehicle component comprising a vehicle seat or a vehicle headliner.

15. The control system of claim 13 wherein the vehicle system comprises a lighting system, an illumination system, an infotainment system, a radio system, a voice control system, or a climate control system.

16. The control system of claim 13 wherein the trim cover textile is configured to cover at least a portion of the vehicle component visible to a user.

17. The control system of claim 13 wherein the trim cover textile is configured to cover at least a portion of the vehicle component unseen by a user.

18. The control system of claim 13 further comprising:
an electrically conductive rivet; and
an electrical conductor having an electrically conductive ring connector;
wherein the electrically conductive ring connector and the electrically conductive element are each configured to receive the electrically conductive rivet to electrically connect the electrically conductive element and the electrical conductor, and wherein the electrical conductor is configured for electrical connection to the control unit.

19. The control system of claim 13 wherein the control switch includes another electrically conductive element attached to the surface of the trim cover textile.

20. The control system of claim 19 wherein the another electrically conductive element is encapsulated and the encapsulated another electrically conductive element is joined to the surface of the trim cover textile.

* * * * *